(12) United States Patent
Aoki et al.

(10) Patent No.: US 7,358,198 B2
(45) Date of Patent: Apr. 15, 2008

(54) SEMICONDUCTOR DEVICE AND METHOD FOR FABRICATING SAME

(75) Inventors: Nobutoshi Aoki, Yokohama (JP);
Koichi Kato, Yokohama (JP);
Katsuyuki Sekine, Yokohama (JP);
Ichiro Mizushima, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 191 days.

(21) Appl. No.: 11/250,439

(22) Filed: Oct. 17, 2005

(65) Prior Publication Data

US 2006/0105582 A1 May 18, 2006

Related U.S. Application Data

(63) Continuation-in-part of application No. 10/127,571, filed on Apr. 23, 2002, now abandoned.

(30) Foreign Application Priority Data

Mar. 8, 2002 (JP) ............................. 2002-063117

(51) Int. Cl.
*H01L 21/31* (2006.01)
(52) U.S. Cl. ............................. 438/769; 257/E21.267
(58) Field of Classification Search ................ 438/769; 257/E21.267
See application file for complete search history.

(56) References Cited

U.S. PATENT DOCUMENTS

| 5,464,783 | A | 11/1995 | Kim et al. |
| 5,969,397 | A | 10/1999 | Grider, III et al. |
| 5,972,804 | A | 10/1999 | Tobin et al. |
| 6,252,296 | B1 | 6/2001 | Umeda et al. |
| 6,417,570 | B1 | 7/2002 | Ma et al. |
| 6,521,912 | B1 * | 2/2003 | Sakama et al. ............... 257/57 |
| 6,953,727 | B2 * | 10/2005 | Hori ............................ 438/275 |
| 2005/0106894 | A1 | 5/2005 | Aoki et al. |

FOREIGN PATENT DOCUMENTS

| JP | 8-37184 | 2/1996 |
| JP | 10-163197 | 6/1998 |
| JP | 10-199878 | 7/1998 |
| JP | H11-121453 | 4/1999 |
| JP | 11-340224 | 12/1999 |
| JP | 2000-269355 | 9/2000 |
| JP | 2001-203198 | 7/2001 |

OTHER PUBLICATIONS

Sukmin Jeong, et al., "Atomic and Electronic Structures of N-Incorporated Si Oxides", Physical Review Letters, Apr. 16, 2001, v.86, pp. 3574-3577.
J. Stober, et al., "Initial Stages of the Thermal Nitridation of the Si(100) Surface with $NH_3$ and NO: A Surface Sensitive Study of Si 2p Core-Level Shifts", Surface Science, 321 (1994) pp. 111-126.
U.S. Appl. No. 11/250,439, filed Oct. 17, 2005, Aoki et al.

* cited by examiner

*Primary Examiner*—Bradley K Smith
(74) *Attorney, Agent, or Firm*—Oblon, Spivak, McClelland, Maier & Neustadt, P.C.

(57) ABSTRACT

A method is provided with:
arranging nitrogen atoms on a surface of a silicon substrate;
performing a heat treatment in a hydrogen atmosphere so that the nitrogen atoms and silicon atoms existing on the surface of the silicon substrate are brought into a three-coordinate bond state; and
forming a silicon oxide film on the silicon substrate with the three-coordinate bond state of nitrogen atoms and the silicon atoms being maintained.

14 Claims, 15 Drawing Sheets

AFTER FIRST NITRIDING + ANNEALING STEP

AFTER SECOND NITRIDING + ANNEALING STEP

SEMICONDUCTOR DEVICE AND METHOD FOR FABRICATING SAME

This application is a continuation-in-part of U.S. patent application Ser. No. 10/127,571.

BACKGROUND OF THE INVENTION

1. Technical Field of the Invention

The present invention relates generally to a semiconductor device having an insulating film, and a method for fabricating the same.

2. Description of Related Art

Since a typical semiconductor oxide film has a very great part as an insulating film in various semiconductor devices, the qualities and forming methods thereof have been variously studied. As a method for forming a semiconductor oxide film, a so-called thermal oxidation process for exposing the surface of a semiconductor to oxygen molecular gas in the atmosphere at high temperatures has been widely used. With the scale down of elements, it is considered that the thickness of the thermal oxide film is decreasing. However, if the thickness of the oxide film is 2 nm or less, the current tunneling through the oxide film rapidly increases to cause a phenomenon that impurities pass through the oxide film to diffuse. For that reason, it is being difficult to improve the performance of elements due to the scale down.

Therefore, there is considered a method for mixing nitrogen in an oxide film to form an oxynitride film. If nitrogen atoms are introduced into an oxide film, the dielectric constant of the oxynitride film increases, so that the thickness of an oxynitride film having the same capacitance as that of an oxide film can be larger. In addition, since the diffusion of impurities, such as boron, can be suppressed, it has been possible to effectively form a thinner high-performance insulating film by the conversion to an oxide film.

However, if nitrogen atoms are introduced into an oxide film, energy levels due to nitrogen atoms are formed in a band gap in the insulating film although the effective thickness can be decreased. For that reason, if an oxide film into which nitrogen atoms are introduced is used as, e.g., a gate insulating film for a MOS transistor, current drivability decreases due to a degradation of carrier mobility. In order to prevent this, there is considered a method for preventing the scattering of electrons by localizing introduced nitrogen atoms in the vicinity of the surface of the gate insulating film so as to be spaced from the interface between the semiconductor layer and the gate insulating film. However, it is difficult for this method to completely control the doping amount and to reduce the energy level due to nitrogen atoms.

Japanese Patent Laid-Open Publication No. 2001-203198 discloses a method for forming an oxynitride film. In this method, the surface of a silicon substrate is hydrogen-terminated, and hydrogen atoms are removed by heat treatment. Thereafter, nitrogen atoms and oxygen atoms are absorbed onto unbonded bonds in a heating atmosphere of NO gas or $NO+O_2$ to form a monoatomic oxynitride layer. Thereafter, it is oxidized in the atmosphere to form an oxynitride film having an oxide layer on the side of the silicon substrate and an oxynitride layer on the side of the surface. However, most of nitrogen atoms in the oxynitride film formed by this method are in a two-coordinate bond state, so that it is difficult to reduce the energy level due to nitrogen atoms in the band gap of the oxynitride film.

SUMMARY OF THE INVENTION

A method for fabricating a semiconductor device according to a first aspect of the present invention includes: arranging nitrogen atoms on a surface of a silicon substrate; performing a heat treatment in a hydrogen atmosphere so that the nitrogen atoms and silicon atoms existing on the surface of the silicon substrate are brought into a three-coordinate bond state; and forming a silicon oxide film on the silicon substrate with the three-coordinate bond state of nitrogen atoms and the silicon atoms being maintained.

A method for fabricating a semiconductor device according to a second aspect of the present invention includes: performing a heat treatment on a silicon substrate in a first hydrogen atmosphere; arranging nitrogen atoms on a surface of the silicon substrate; performing a heat treatment in a second hydrogen atmosphere so that the nitrogen atoms and silicon atoms existing on the surface of the silicon substrate are brought into a three-coordinate bond state; and forming a silicon oxide film on the silicon substrate with the three-coordinate bond state of the nitrogen atoms and the silicon atoms being maintained.

A semiconductor device according to a third aspect of the present invention includes a silicon oxynitride film having a thickness of 2 nm or less, the silicon oxynitride film including an oxynitride layer which is formed on at least a surface of a silicon substrate and in which nitrogen atoms are in a three-coordinate bond state, and a silicon oxide layer which is formed between the oxynitride layer and the silicon substrate.

DESCRIPTION OF THE EMBODIMENTS

Referring now to the accompanying drawings, the embodiments of the present invention will be described below.

First Embodiment

Figure 1:
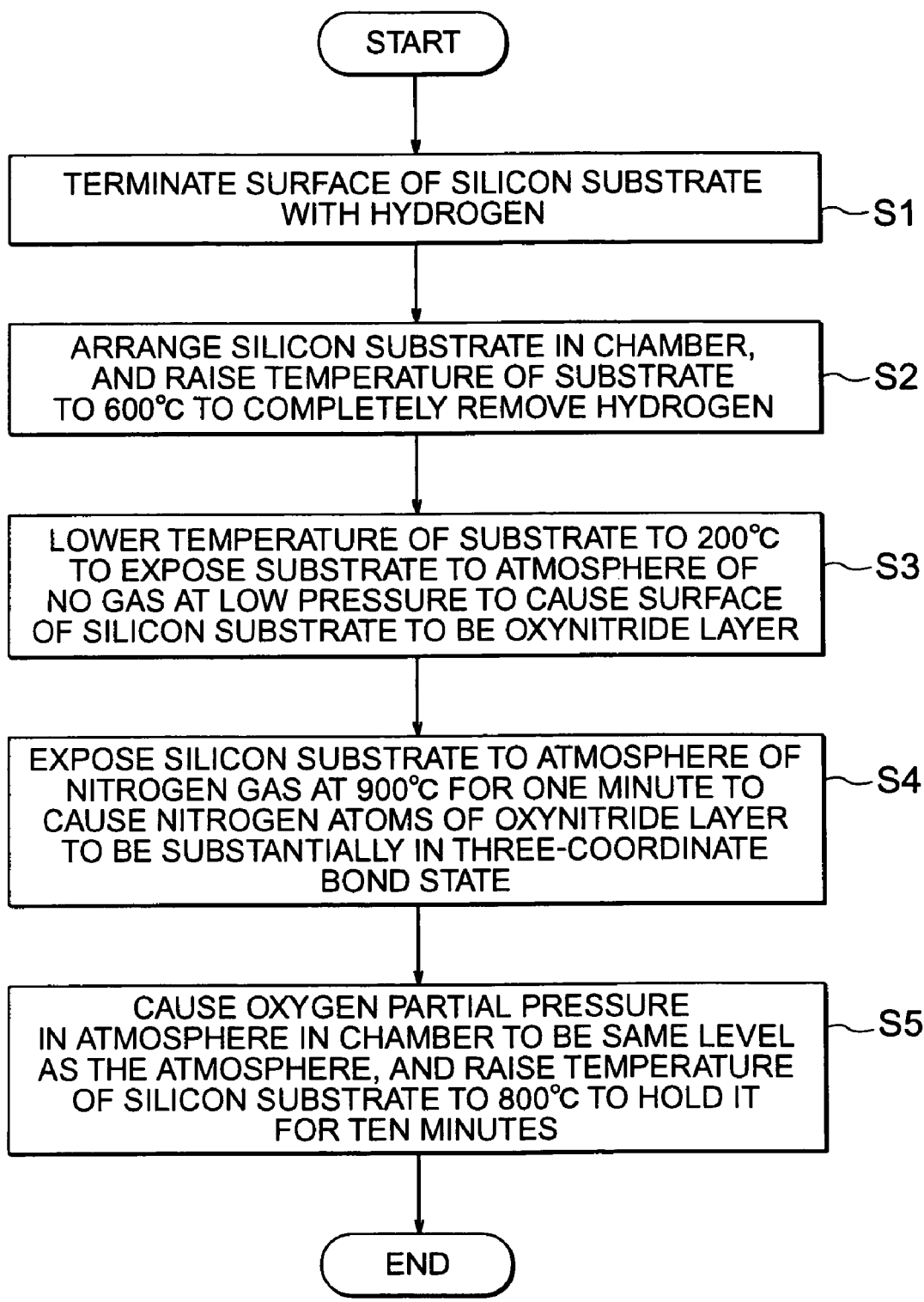
FIG. 1 is a flow chart showing fabricating steps of a method for fabricating a semiconductor device according to the first embodiment of the present invention.

Referring to FIGS. 1 through 4, a method for fabricating a semiconductor device according to the first embodiment of the present invention will be described below. The semiconductor device fabricating method in this first embodiment is a method for fabricating a semiconductor device having an oxynitride film, and the steps of fabricating an oxynitride film are shown in FIG. 1. The fabrication of the oxynitride film in this first embodiment is carried out by using an oxynitride film forming apparatus shown in FIG. 2. Before describing the fabricating method in the first embodiment, the oxynitride film forming apparatus shown in FIG. 2 will be described below.

Figure 2:
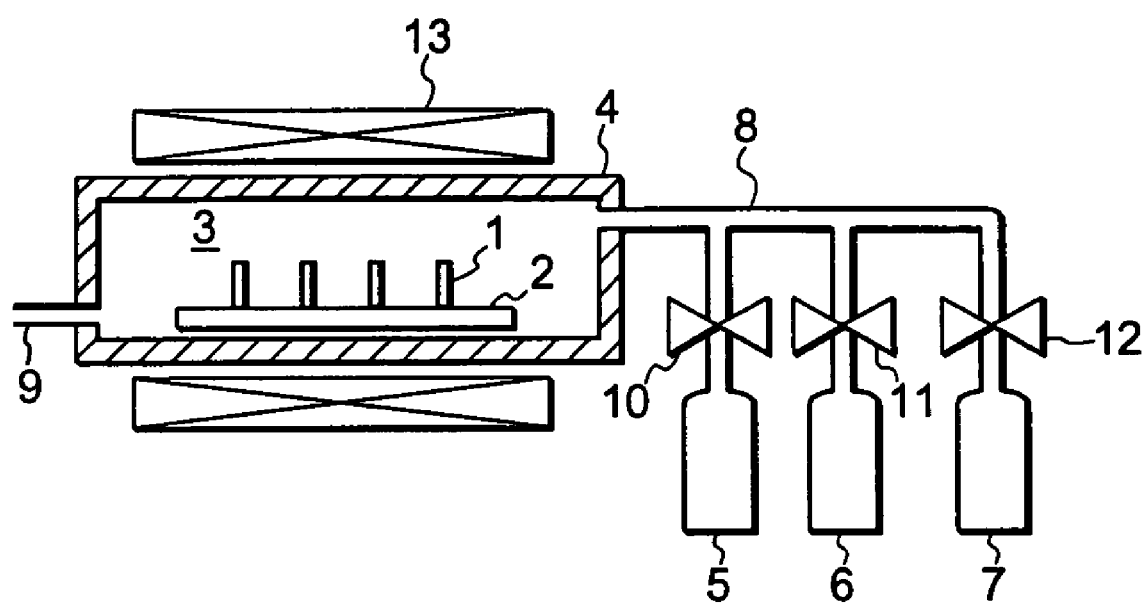
FIG. 2 is a block diagram showing the construction of an oxynitride film forming apparatus for use in the fabricating steps in the first embodiment.

As shown in FIG. 2, this oxynitride film forming apparatus has a chamber 4 having a heating furnace 3 for housing therein a movable susceptor 2 for supporting thereon a plurality of semiconductor substrates 1. To this chamber 4, an NO gas source 5, a nitrogen gas source 6 and an oxygen gas source 7 are connected as atmospheric gas sources. The chamber 4 is provided with a gas inlet 8 for feeding NO gas, nitrogen gas and oxygen gas into the chamber 4 from these gas sources, and a gas outlet 9 for discharging gases. On the NO gas source 5, nitrogen gas source 6 and oxygen gas source 7, valves 10, 11 and 12 are mounted, respectively, for enabling the control of the partial pressures of gases. A heater 13 is provided around the chamber 4 to be controlled by a temperature control unit (not shown).

Referring to FIGS. 1 and 2, the first embodiment of a fabricating method according to the present invention will be described below.

First, as shown at step Si in FIG. 1, a silicon substrate 1 having (100) plane as a principal plane is treated with diluted hydrofluoric acid, so that the surface of the silicon substrate terminates with hydrogen. Then, as shown at step S2 in FIG. 1, the silicon substrate terminating with hydrogen is mounted on the susceptor 2, and the valves 10, 11 and 12 are open and closed at room temperatures so that the atmosphere in the chamber 4 is only nitrogen gas. Subsequently, the heater 13 provided around the chamber 4 is controlled to raise the temperature of the silicon substrate 1 to 600° C. to completely remove hydrogen from the silicon substrate 1 (see step S2 in FIG. 1).

Thereafter, as shown at step 53, the heater 13 is controlled to lower the temperature of the silicon substrate 1 to 200° C. Moreover, the valve 10 is open and closed to mix NO gas with a partial pressure of $10^{-6}$ Torr ($=10^{-6} \times 133.322$ Pa) to hold it for one minute. Thus, an oxide film containing nitrogen atoms (an oxynitride film) is formed on the first layer of the silicon substrate 1.

Figure 3:
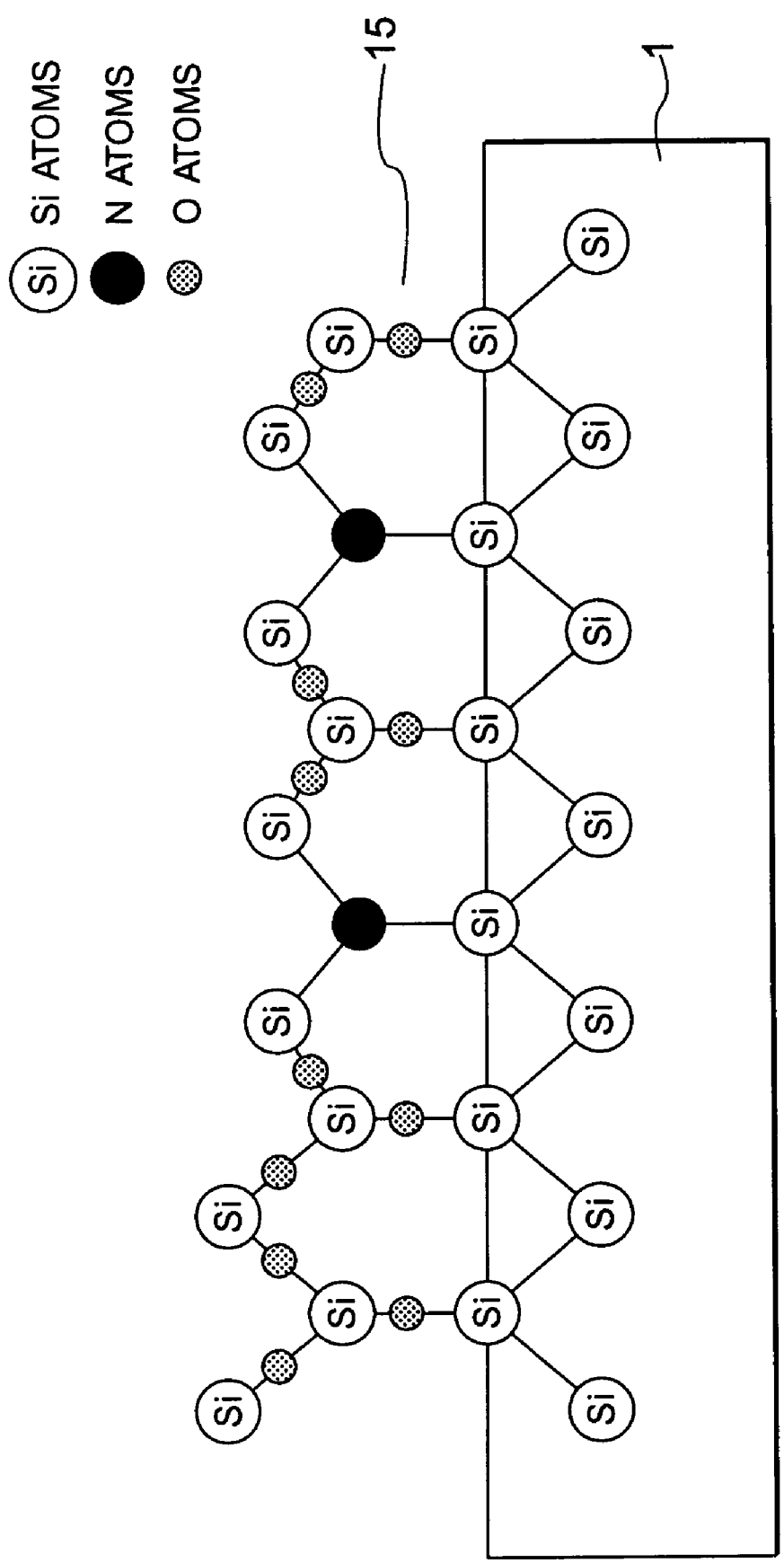
FIG. 3 is a sectional view showing the state where an oxynitride layer is formed in the first layer on the surface in the middle of the fabricating steps in the first embodiment.

Then, as shown at step S4, the valves 10, 11 and 12 are open and closed again so that the atmosphere in the chamber 4 is only nitrogen gas, and the heater 13 is controlled to raise the temperature of the silicon substrate 1 to 900° C. to hold it for one minute. Thus, as shown in FIG. 3, nitrogen atoms in a first layer 15 of the silicon substrate 1 are substantially in a three-coordinate bond state to form a stable structure. Furthermore, the temperature range for providing a three-coordinate bond state is preferably in the range of from 600° C. to 950° C.

Figure 4:
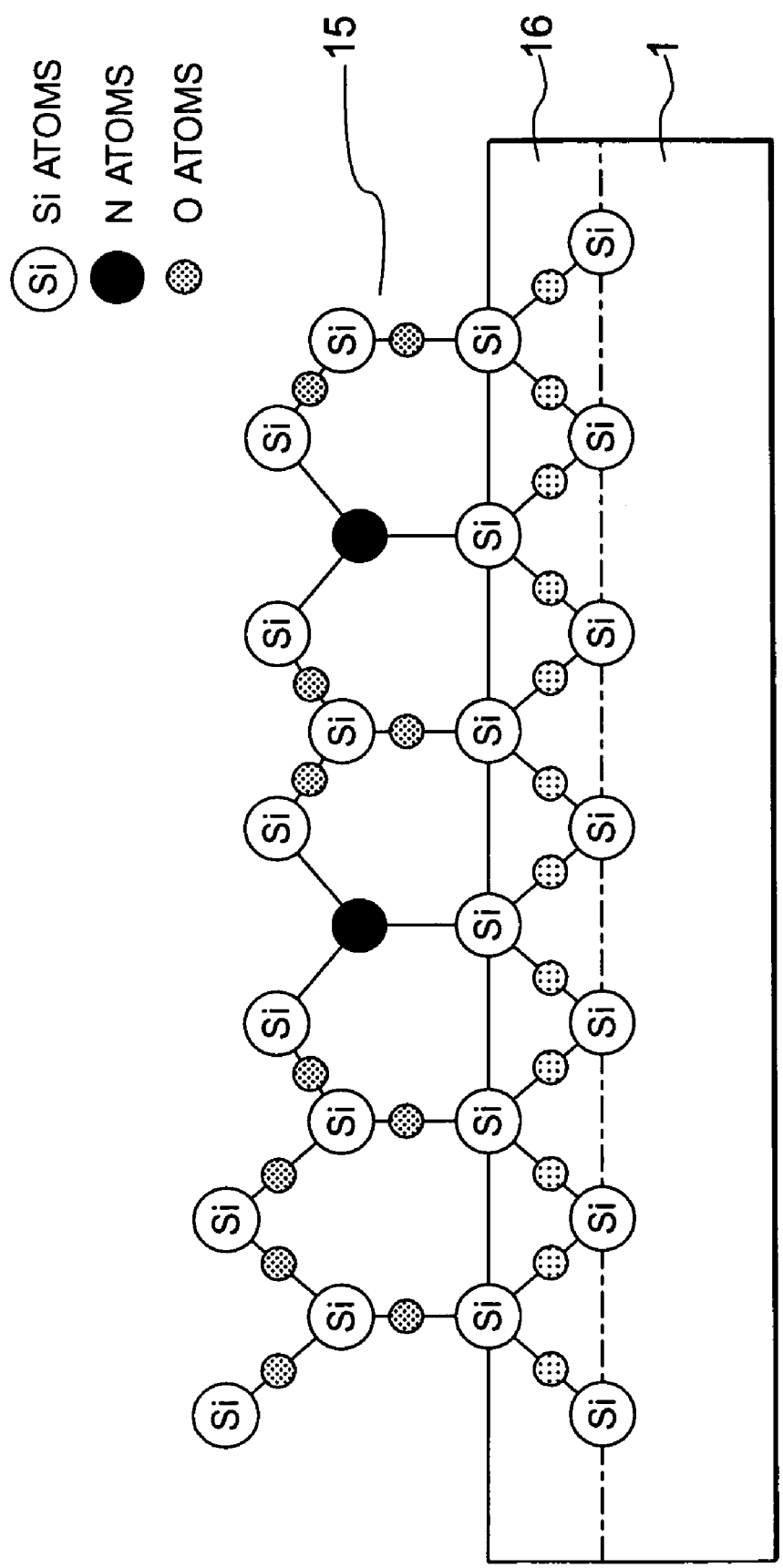
FIG. 4 is a sectional view showing the state where an oxynitride layer is formed in the first layer on the surface and an oxide layer is formed in the second layer from the surface in the middle of the fabricating steps in the first embodiment.

Subsequently, the valves 10, 11 and 12 are open and closed so that the partial pressure of oxygen in the atmosphere in the chamber 4 is raised to the same level as that in the atmosphere, and the temperature of the silicon substrate 1 is raised to 800° C. to be held for ten minutes. Thus, as shown in FIG. 4, an oxynitride layer is formed in the first layer 15 on the surface of the silicon substrate 1, and an oxide layer 16 is formed in the second and subsequent layers below the first layer 15. That is, nitrogen atoms in the first layer 15 on the surface of the silicon substrate 1 are maintained in a three-coordinate bond state to form an oxynitride film on the surface of the silicon substrate and to form the oxide layer 16 in the second and subsequent layers. Thus, a silicon oxynitride film is formed, which has the first layer 15 to be an oxynitride layer and the second layer 16 and subsequent layers to be oxide layers, and which has an interface structure being a flat structure at an atomic level and a thickness of 20 Å ($=2$ nm) or less. Thus, the energy levels in the band gap are greatly reduced. Furthermore, although the oxynitride film is formed on the surface of the silicon substrate 1, it is preferably formed on the uppermost surface, i.e., the first layer.

As can be understood from FIG. 4, in a semiconductor device fabricated by the fabricating method of this embodiment, the atoms that are the closest to a nitrogen atom in a three-coordinate bond state are silicon atoms, and the atoms that are next closest are atoms other than silicon atoms, e.g., oxygen atoms.

As described above, according to the fabricating method in this embodiment, the oxynitride film having the three-coordinate-bonded nitrogen is formed, and the second and subsequent layers from the surface are complete oxide layers. Therefore, it is possible to obtain an oxynitride film wherein the interface structure is a flat structure at an atomic level, and it is possible to obtain a silicon oxynitride film (insulating film) wherein the energy level due to nitrogen atoms in the band gap is reduced.

Generally, when the gate insulating film is formed of only a silicon oxide film and has a thickness of 2 nm or less, the impurities doped into the gate electrode (in particular boron (B)) diffuse into the silicon substrate. However, when the silicon oxynitride film of the semiconductor device fabricated in accordance with the fabricating method of this embodiment is used as a gate insulating film of a MOSFET, even if the thickness of the gate insulating film is 2 nm or less, it is possible to prevent the impurities doped into the gate electrode (in particular boron (B)) from diffusing into the silicon substrate since the degree of diffusion of boron in a silicon oxynitride film is less than that in a silicon oxide film.

Furthermore, nitrogen molecular radicals may be substituted for nitrogen gas.

While it has been exposed to an atmosphere of oxygen at 800° C. for ten minutes in this embodiment, various temperatures and times can be combined as long as the oxynitride film having the three-coordinate-bonded nitrogen in the first layer of the silicon substrate 1 is formed, and materials other than oxygen can be used as long as an oxidization reaction occurs.

While hydrogen on the surface of the silicon substrate 1 is removed at the heating step before the oxidizing step, the removal of hydrogen may be carried out at a step other than the heating step.

In the place of nitrogen gas, a gas of a kind which does not react with the semiconductor, e.g., an inert gas such as argon gas, may be used. A semiconductor causing an oxidation reaction on a portion other than the silicon substrate may be used as a semiconductor used in this embodiment.

Second Embodiment

Figure 5:
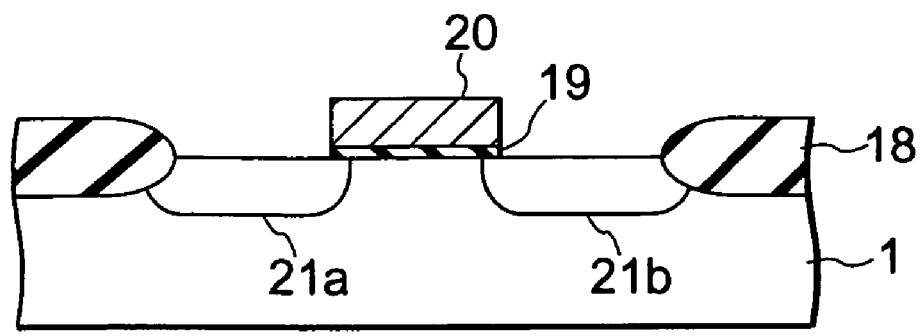
FIG. 5 is a sectional view showing the construction of a MOSFET formed by a fabricating method according to the second embodiment of the present invention.

Referring to FIG. 5, a method for fabricating a semiconductor device according to the second embodiment of the present invention will be described below. The fabricating method in this second embodiment uses the fabricating method in the first embodiment to form a gate oxide film of a MOSFET. First, as shown in FIG. 5, a field oxide film 18 is formed on a silicon substrate 1. On the surface of an element region isolated by the field oxide film 18, a gate oxynitride film 19 is formed. In this case, the gate oxynitride film 19 having a thickness of 20 Å or less is formed by the oxynitride film forming method described in the first embodiment. Thereafter, a gate electrode material is deposited thereon and patterned to form a gate electrode 20. Subsequently, the gate electrode 20 is used as a mask to form a source region 21a and a drain region 21b by ion implantation to obtain a MOSFET.

The gate oxynitride film 19 thus formed has a very uniform interface. As a result, the obtained MOSFET has a small variation in threshold voltage, no deterioration of mobility, and stable characteristics.

Figure 6:
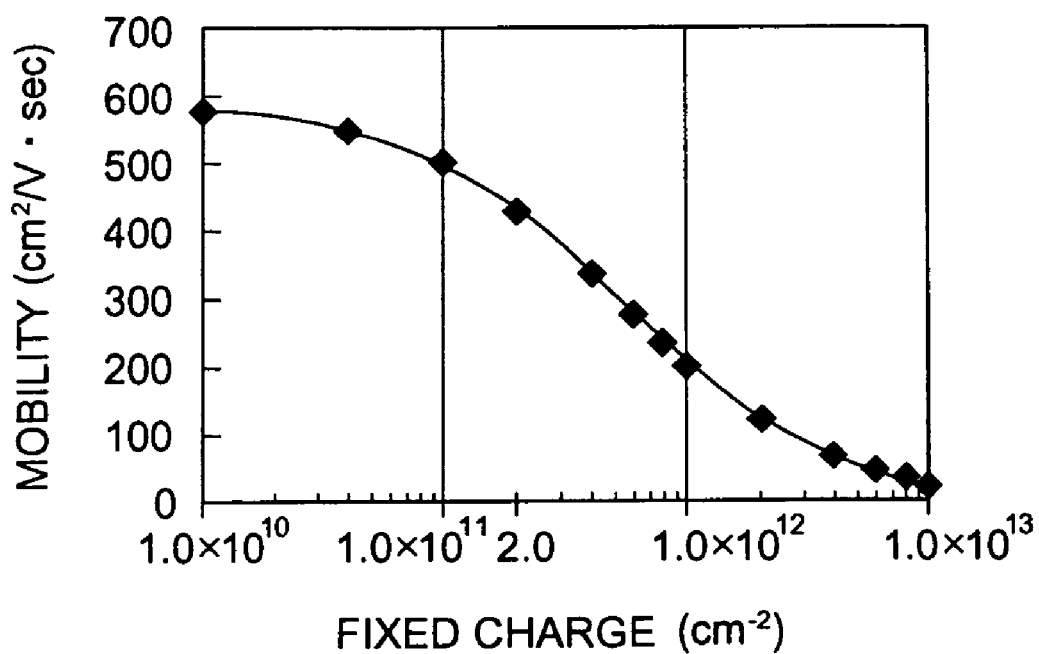
FIG. 6 is a graph showing the relationship between fixed charges and the mobility of electrons on the interface between a silicon substrate and a silicon oxynitride film.

Furthermore, in the oxynitride films formed by the above described fabricating methods in the first and second embodiments, most of nitrogen atoms in the oxynitride films have the three-coordinate bonds. The allowable contents of nitrogen atoms of coordinate bonds different from the three-coordinate bonds will be described below. If all of nitrogen atoms have the three-coordinate bonds, the fixed charge is zero, whereas if there are nitrogen atoms of coordinate bonds different from the three-coordinate bonds, the fixed charge occurs. Therefore, the amount of nitrogen atoms of coordinate bonds different from the three-coordinate bonds can be defined by the amount of fixed charges since it is in proportion to the amount of fixed charges. If the relationship between the amount of fixed charges and the mobility of electrons on the interface between the silicon oxynitride film produced in the above described embodiment and the silicon substrate is simulated, the characteristic graph shown in FIG. 6 is obtained. As can be seen from this characteristic graph, the mobility of electrons rapidly deteriorates if the amount of fixed charges exceeds $1.0\times10^{11}$ $(cm^{-2})$ to $2.0\times10^{11}$ $(cm^{-2})$. Therefore, in order to prevent the deterioration of the performance of the element, the amount of fixed charges is preferably $2.0\times10^{11}$ $(cm^{-2})$ or less. Furthermore, in the above descriptions, the amount of fixed charges is the value on the interface between the silicon oxynitride film and the silicon substrate. However, it has been understood that the amount of fixed charges hardly varies in a range of 10 Å from the above described interface in a direction perpendicular to the silicon oxynitride film.

Third Embodiment

Figure 7:
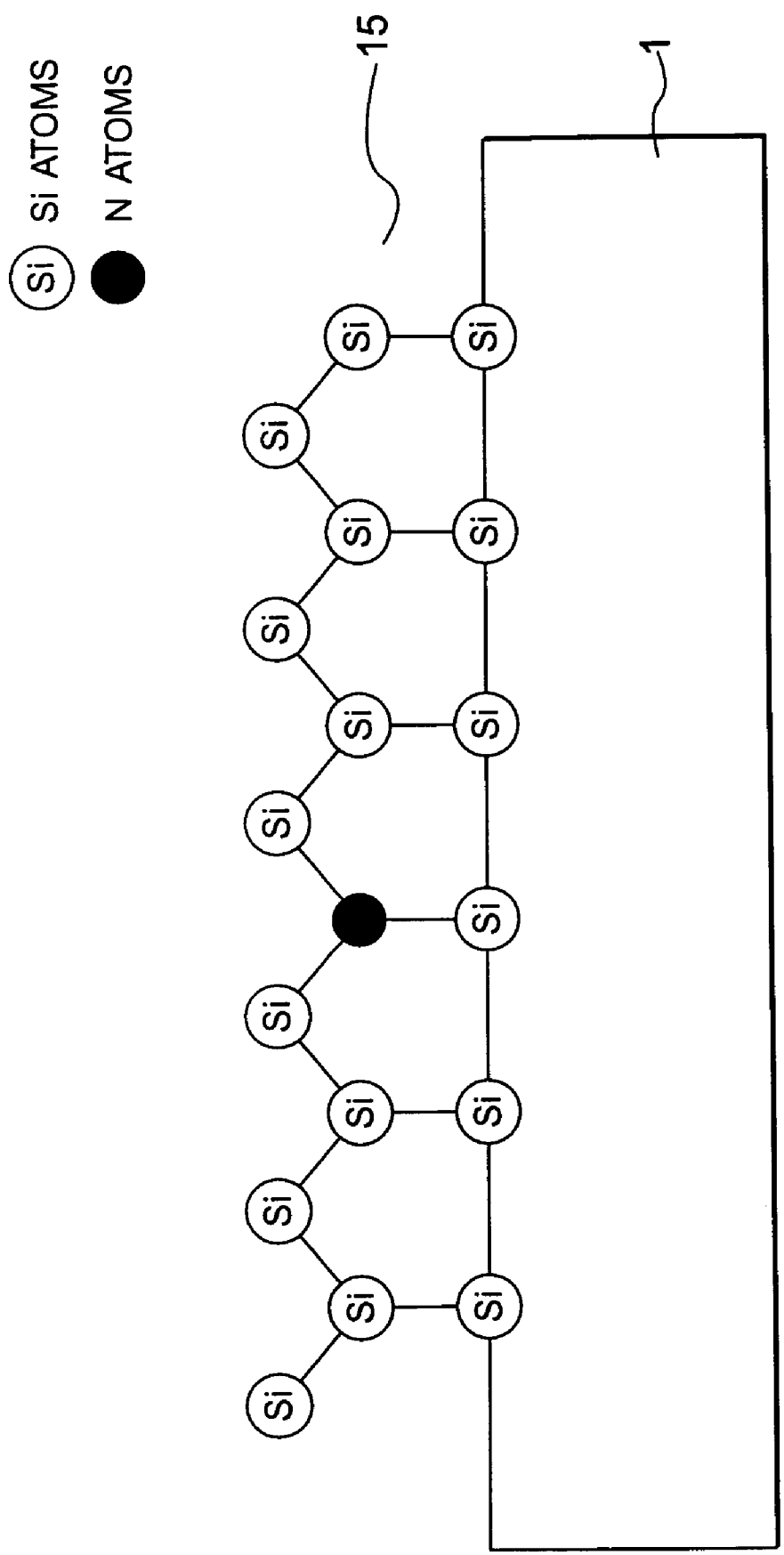
FIG. 7 is a sectional view showing the state where nitrogen atoms are in a three-coordinate bond state on the surface of a silicon substrate in the middle of the fabricating steps in the third embodiment.
Figure 8:
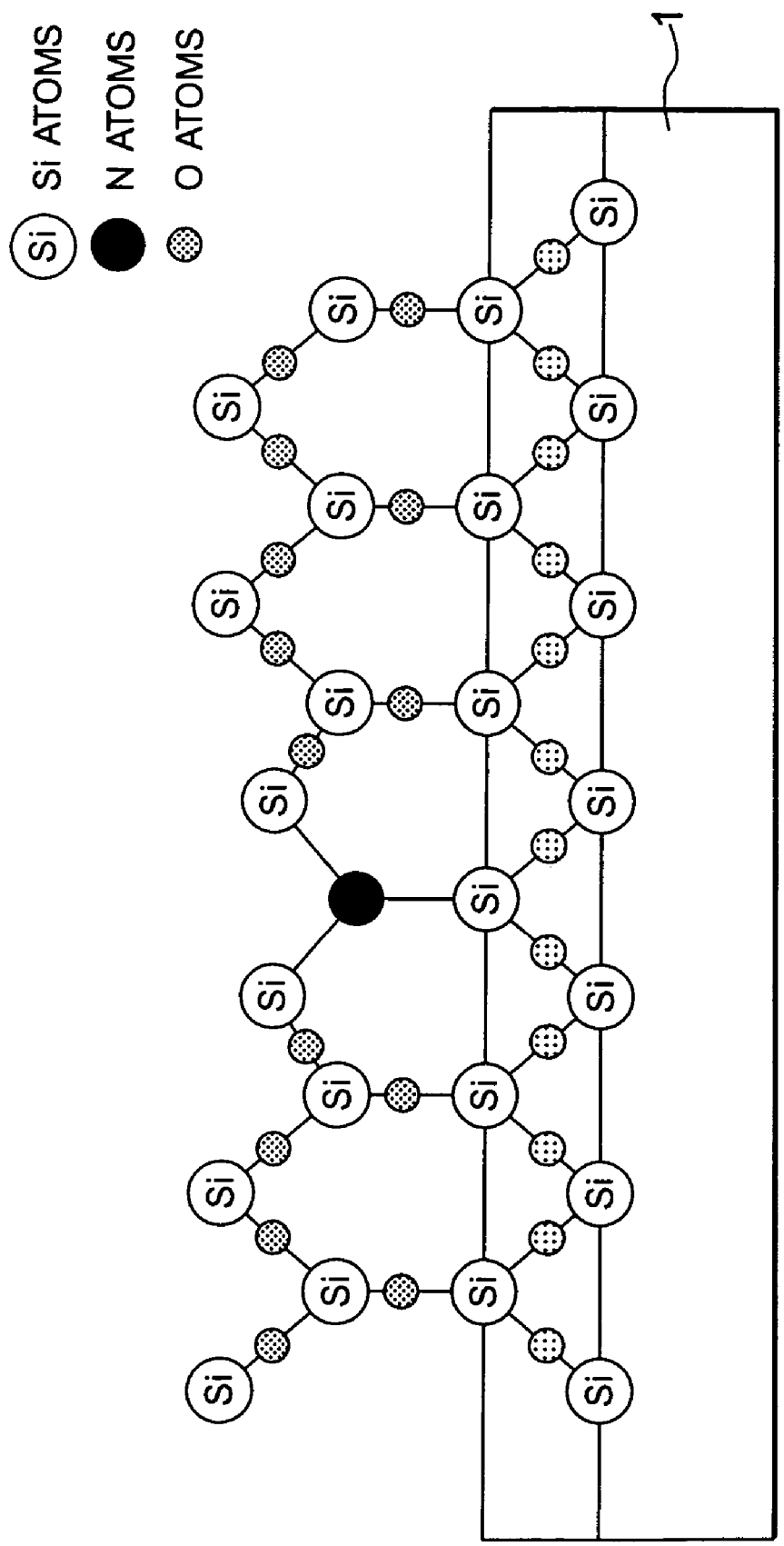
FIG. 8 is a sectional view of a semiconductor device fabricated by a fabricating method according to the third embodiment of the present invention.

Referring to FIGS. 7 and 8, a method for fabricating a semiconductor device according to the third embodiment of the present invention will be described below.

In the above described first and second embodiments, the method for forming the oxynitride film using NO gas has been described. In the following embodiment, a method for forming an oxide film after arranging nitrogen atoms on the surface of a silicon substrate will be described.

In the fabricating method of this embodiment, nitrogen atoms are arranged on the surface of a silicon substrate prior to the above described usual oxidation. For example, nitrogen atoms are introduced to the surface of the silicon substrate by plasma nitriding, and thereafter, a high-temperature heating process is carried out. FIG. 7 schematically shows nitrogen atoms and silicon atoms on the surface of the silicon substrate 1 after the high-temperature heating process. As can be seen from FIG. 7, nitrogen atoms on the surface of the silicon substrate 1 are in the three-coordinate bond state with adjacent silicon atoms.

Subsequently, an oxidation process is carried out under a reduced pressure to oxidize the silicon substrate 1. Oxidizing conditions can be optionally set. In this embodiment, an oxide film having a thickness of 1 nm was formed at an oxygen partial pressure of 40 Torr at a temperature of 700° C. FIG. 8 schematically shows the bonding state of oxygen atoms, nitrogen atoms and silicon atoms on the surface of the silicon substrate 1 and in the oxide film after oxidation. As can be seen from FIG. 8, since nitrogen atoms are in the three-coordinate bond state with silicon atoms, the configuration of nitrogen atoms is energetically stable, and the change of state is not carried out even in the oxidation reaction, i.e., the three-coordinate bond state is held, so that nitrogen atoms exist on the surface of the oxide film. Moreover, since nitrogen atoms form stable three-coordinate bonds with silicon atoms, a high quality of insulating film having a small amount of energy levels in the gap is formed similar to the first embodiment.

Fourth Embodiment

Figure 9:
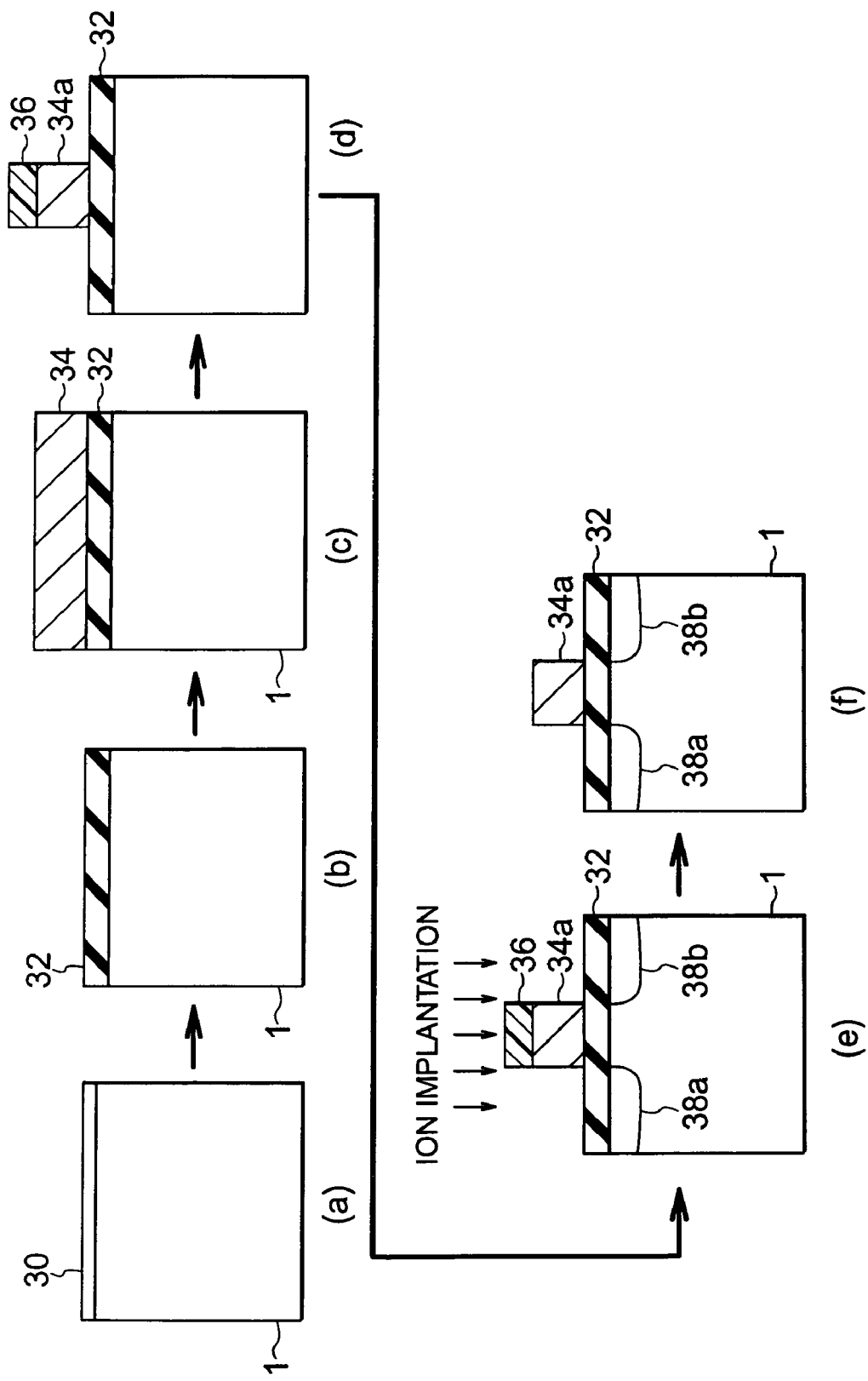
FIG. 9 is a sectional view showing the fabricating steps of a fabricating method according to the fourth embodiment of the present invention.

Referring to FIG. 9, a method for fabricating a semiconductor device according to the fourth embodiment of the present invention will be described below. The fabricating process in this fourth embodiment is a method for fabricating a MOSFET, and forms a gate insulating film using the fabricating method in the third embodiment.

First, as shown in FIG. 9(a), nitrogen atoms are arranged on part of the surface of the silicon substrate 1 to form a region 30, in which nitrogen atoms are in the three-coordinate bond state with silicon atoms, by a high-temperature heat treatment. In this embodiment, nitrogen atoms are introduced into the silicon substrate 1 at a low energy (10 eV) with plasma so that the density of nitrogen is $5.0\times10^{14}$ $cm^{-2}$. In addition, in order for nitrogen to be in the three-coordinate bond state, annealing was carried out at 950° C. for thirty minutes. Furthermore, a method for introducing nitrogen atoms onto the surface of the silicon substrate 1 may use a nitrogen atom containing gas, or use a gas having a reducing action to cause nitrogen atoms to remain on the surface of the silicon substrate after an oxygen containing gas, such as NO gas, is used for introducing nitrogen. In this embodiment, the heat treatment was carried out at 950° C.

for thirty minutes as a step of causing the three-coordinate bond state. However, temperature and time can be optionally set.

Then, as shown in FIG. 9(b), the surface of the silicon substrate 1 is oxidized to form an insulating film (oxynitride film) 32 on the surface of the silicon substrate 1. In this embodiment, the oxide film having a thickness of 1 nm was formed at 700° C. at an oxygen partial pressure of 40 Torr. However, the oxidation atmosphere, time and the partial pressure of gas can be optionally set, and the radical oxidation or the like can be used.

Then, as shown in FIG. 9(c), a polysilicon film 34 is deposited on the insulating film 32. Subsequently, as shown in FIG. 9(d), the lithography technique or the like is used for forming a photoresist pattern 36 on the polysilicon film 34, and the photoresist pattern 36 is used as a mask for patterning the polysilicon film 34 to form a gate electrode 34a (see FIG. 9(d)).

Then, as shown in FIG. 9(e), the photoresist pattern 36 and the gate electrode 34a are used as a mask for implanting impurity ions to form a source region 38a and a drain region 38b.

Then, as shown in FIG. 9(f), after the photoresist pattern 36 is removed, annealing is carried out for activation. Thereafter, the formation of an insulating film between wiring portions and the formation of wiring portions are carried out by a usual method to complete a semiconductor device.

As described above, also in this fourth embodiment similar to the third embodiment, nitrogen atoms form stable three-coordinate bonds with silicon atoms, so that a high quality gate insulating film having a small amount of energy levels in the gap is formed. Thus, it is possible to form a uniform and stable MOSFET wherein the variation in threshold voltage is small and the mobility does not deteriorate.

Furthermore, in the above described third and fourth embodiments, nitrogen atoms in the insulating film are substantially in the three-coordinate bond state. Similar to the first and second embodiments, the allowable contents of nitrogen atoms of coordinate bonds different from the three-coordinate bonds in the insulating film are defined by the amount of fixed charges, and the amount of fixed charges is preferably $2.0 \times 10^{11}$ (cm$^{-2}$) or less in order to prevent the deterioration of the performance of the element.

Figure 10:
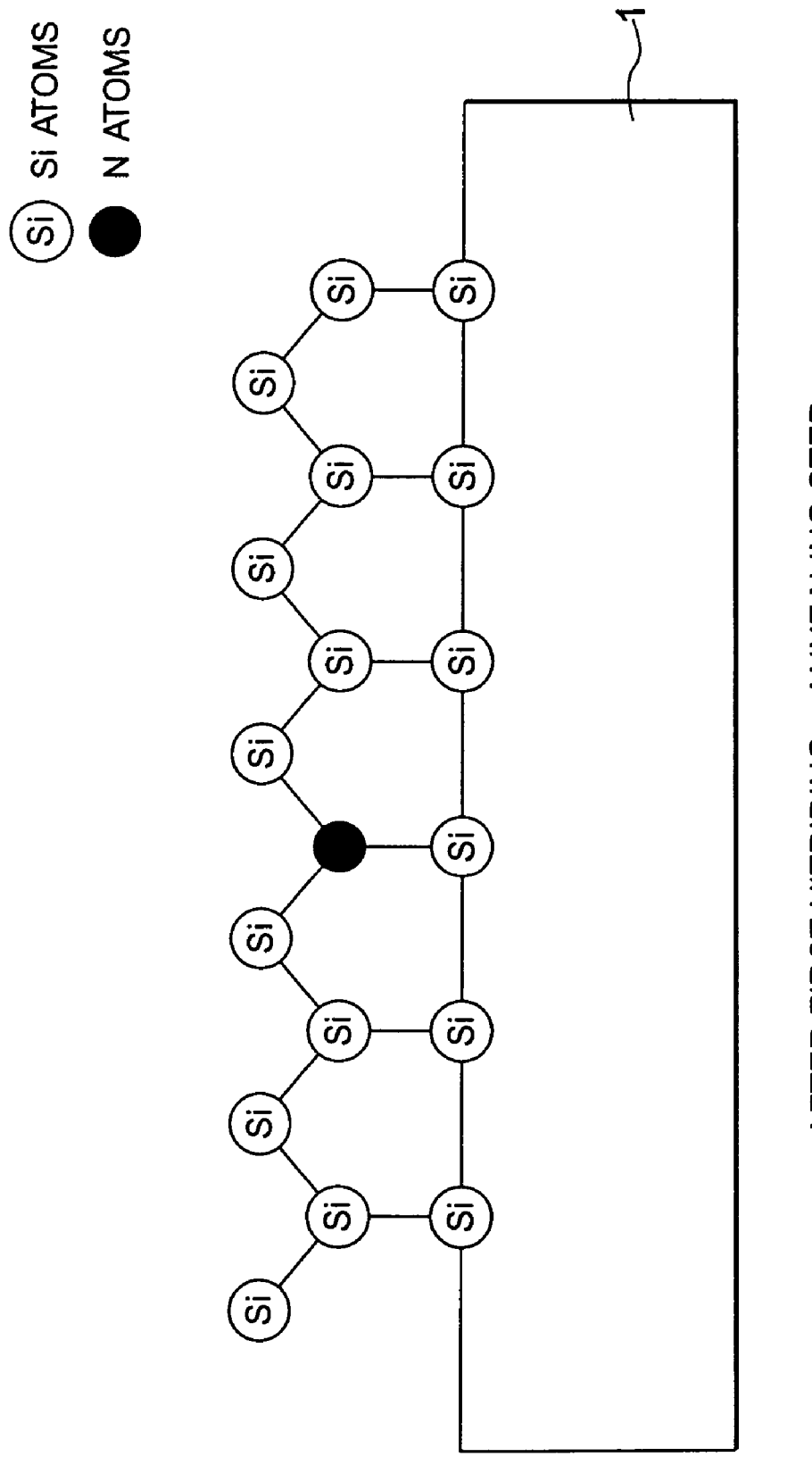
FIG. 10 is a sectional view of a semiconductor device after a first nitriding and annealing step is carried out.
Figure 11:
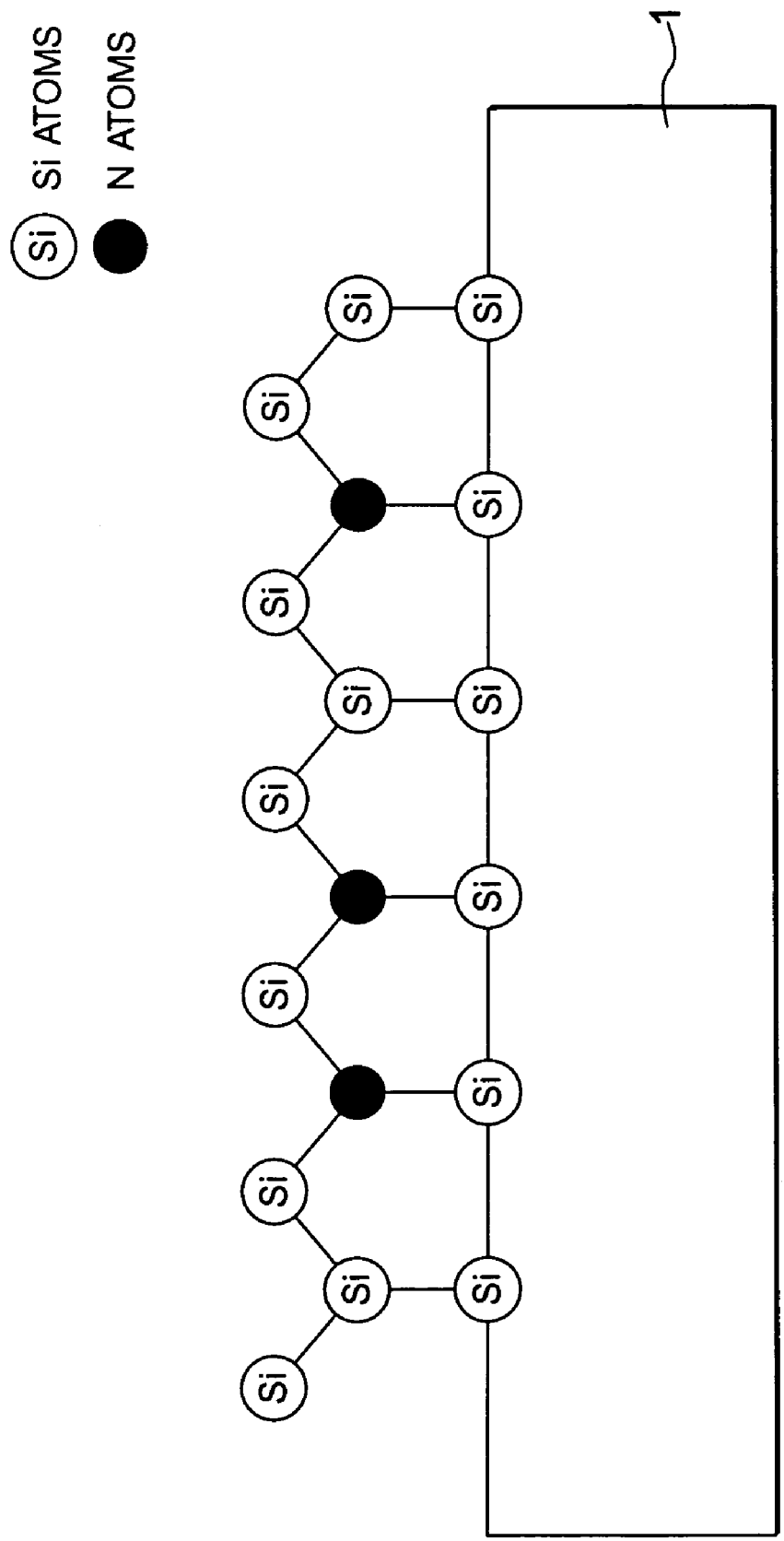
FIG. 11 is a sectional view of a semiconductor device after a second nitriding and annealing step is carried out.

In the above described first through fourth embodiments, the step of nitriding the surface of the silicon substrate 1 to provide the three-coordinate bond state by annealing is carried out only one time. However, after a step of nitriding the surface of the silicon substrate 1 to provide the three-coordinate bond state by annealing as shown in FIG. 10 is carried out one time and before the silicon oxide film is formed, a step of nitriding the surface of the silicon substrate 1 to carry out annealing as shown in FIG. 11 may be repeated at least one time.

By repeating the step of nitriding the surface of the silicon substrate 1 to provide the three-coordinate bond state by annealing, it is possible to enhance the density of nitrogen atoms in the three-coordinate bond state on the surface of the silicon substrate 1, so that it is possible to obtain an insulating film wherein energy levels in the band gap are reduced.

Fifth Embodiment

Figure 12:
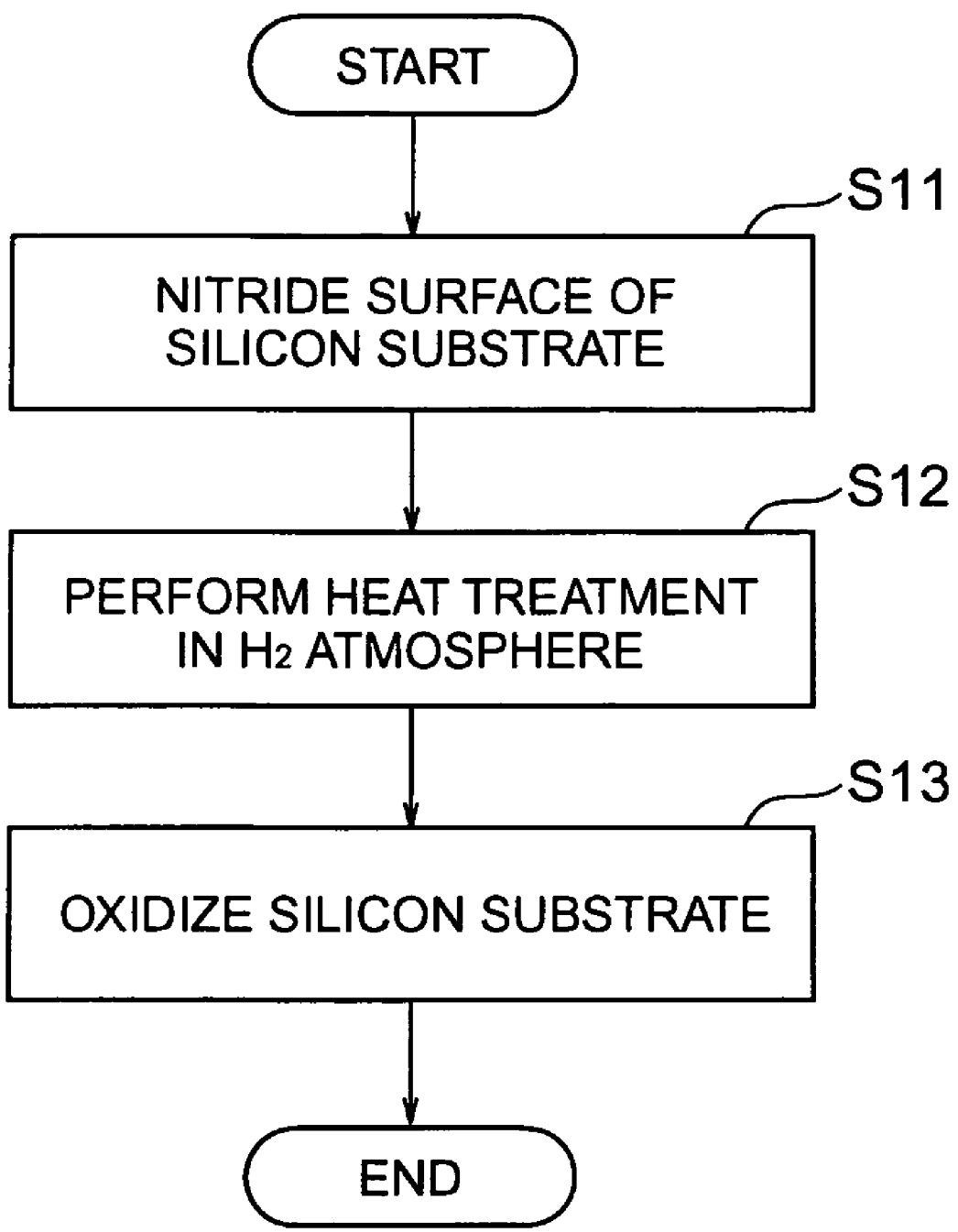
FIG. 12 is a flow chart showing the fabricating steps of a fabricating method according to the fifth embodiment of the present invention.
Figure 13:
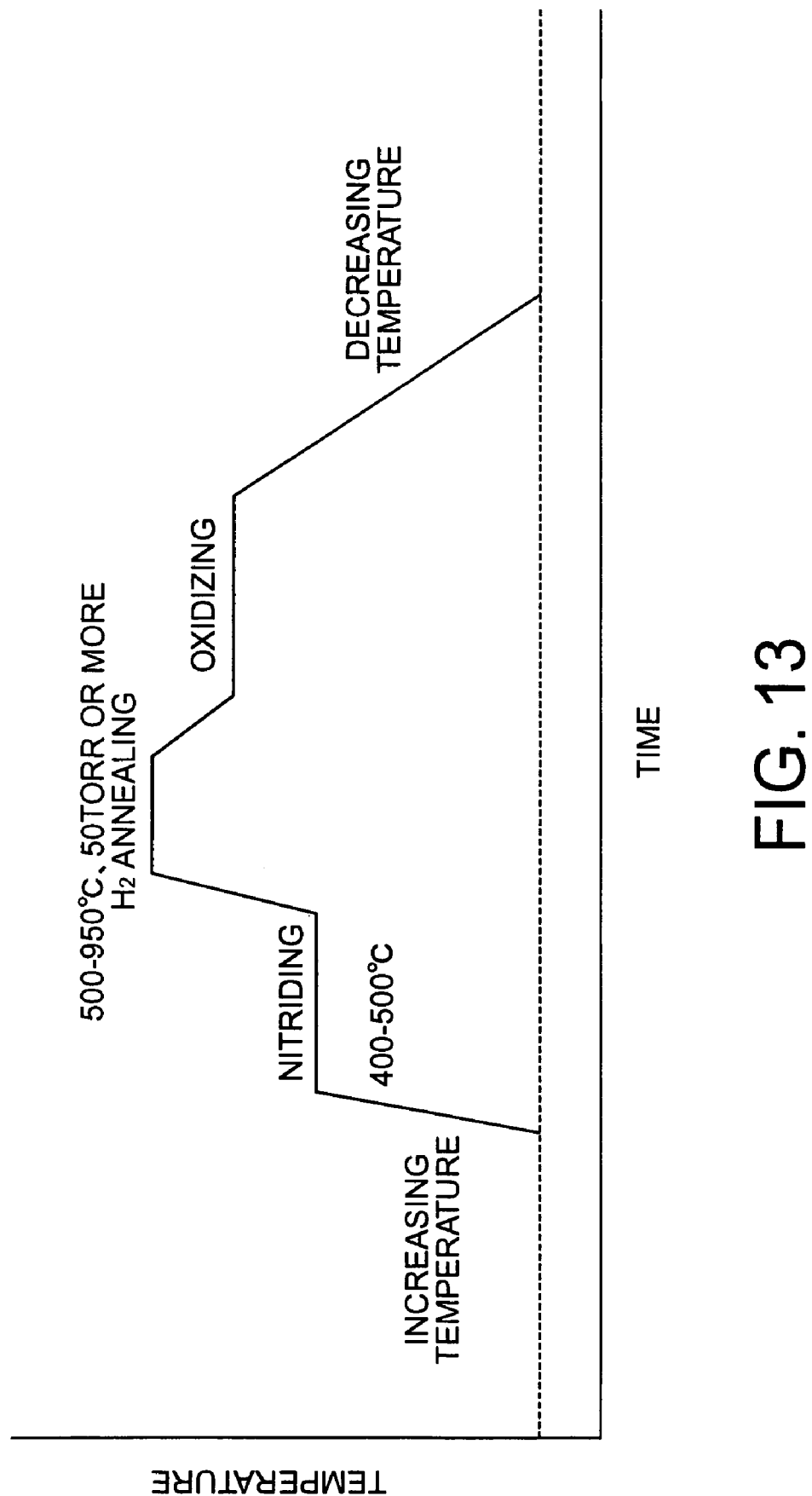
FIG. 13 is a timing chart of a heat treatment in the fabricating method according to the fifth embodiment of the present invention.

Referring to FIG. 12 and FIG. 13, a method for fabricating a semiconductor device according to the fifth embodiment of the present invention will be described below. The fabricating method in this fifth embodiment is a method for fabricating an oxynitride film. FIG. 12 shows the fabricating method, and FIG. 13 shows a timing chart of a heat treatment.

First, as shown at step S11 of FIG. 12, the surface of the silicon substrate is nitrided, i.e., nitrogen atoms are arranged on the surface of the silicon substrate. For example, as explained in the descriptions in the third embodiment, nitrogen atoms are introduced to the surface of the silicon substrate by plasma nitriding, and thereafter, a heat treatment (annealing) is performed at a high temperature. As shown in FIG. 13, the annealing is performed at a temperature in the range of from 400° C. to 500° C. As explained in the descriptions in the third embodiment, the nitrogen atoms at the surface of the silicon substrate are in a three-coordinate bond state with the silicon atoms adjacent thereto. The plasma nitriding can be replaced by nitriding using NH$_3$ gas.

Next, a heat treatment is performed in an H$_2$ atmosphere, as shown in step S12 of FIG. 12. An effect of performing a heat treatment in an H$_2$ atmosphere is to facilitate the movement of silicon atoms and nitrogen atoms on the surface of the silicon substrate, thereby effectively changing the state of the nitrogen atoms to the three-coordinate bond state, which is stable. Another effect is that since the oxygen atoms near the surface are removed during the heat treatment in the H$_2$ atmosphere, the nitrogen atoms are brought into the stable coordination state without being hindered by oxygen atoms. The heat treatment conditions in the H$_2$ atmosphere can be optionally set. However, it is preferable that the temperature is set to be equal to or less than a temperature at which nitrogen (N) atoms are removed (950° C.) and equal to or more than a temperature at which nitrogen and oxygen atoms can move on the surface (500° C.), and that the partial pressure of H$_2$ gas is set to be equal to or more than a pressure at which nitrogen atoms are removed (50 Torr). Considering these conditions, the heat treatment conditions of this embodiment are set as shown in FIG. 13, i.e., a temperature of 500° C. or more and 950° C. or less, and an H$_2$ partial pressure of 50 Torr or more. When the pressure is less than 50 Torr, the surface becomes coarse since SiH is removed.

After the heat treatment in the H$_2$ atmosphere, the silicon substrate is oxidized (step S13 of FIG. 12). Although oxidation conditions can be optionally set, in this embodiment, the oxygen partial pressure is set to be 40 Torr and the temperature is set to be 700° C., as shown in FIG. 13. After the oxidation, an oxide film having a thickness of 1 nm is formed. The bonding state of oxygen, nitrogen, and silicon atoms on the surface of the silicon substrate and in the oxide film after the oxidation is the same as that of the third embodiment shown in FIG. 8. As can be seen from FIG. 8, since nitrogen atoms are in the three-coordinate bond state with silicon atoms, the state of nitrogen atoms is energetically stable, and the change of state is not carried out even in the oxidation reaction, i.e., the three-coordinate bond state is held, so that nitrogen atoms exist on the surface of the oxide film. Moreover, since nitrogen atoms are in the stable three-coordinate bonds with silicon atoms, a high-quality insulating film having a small amount of energy levels in the gap is formed as in the case of the first embodiment.

In the descriptions of FIG. 12, the surface nitriding, the heat treatment in the H$_2$ atmosphere, and the oxidation were separately explained. Although these steps can be performed in separate devices, it is desirable that these steps be sequentially performed in order to form an insulating film having a better film quality. Such sequential processing will be described as the sixth embodiment below.

Sixth Embodiment

Figure 14:
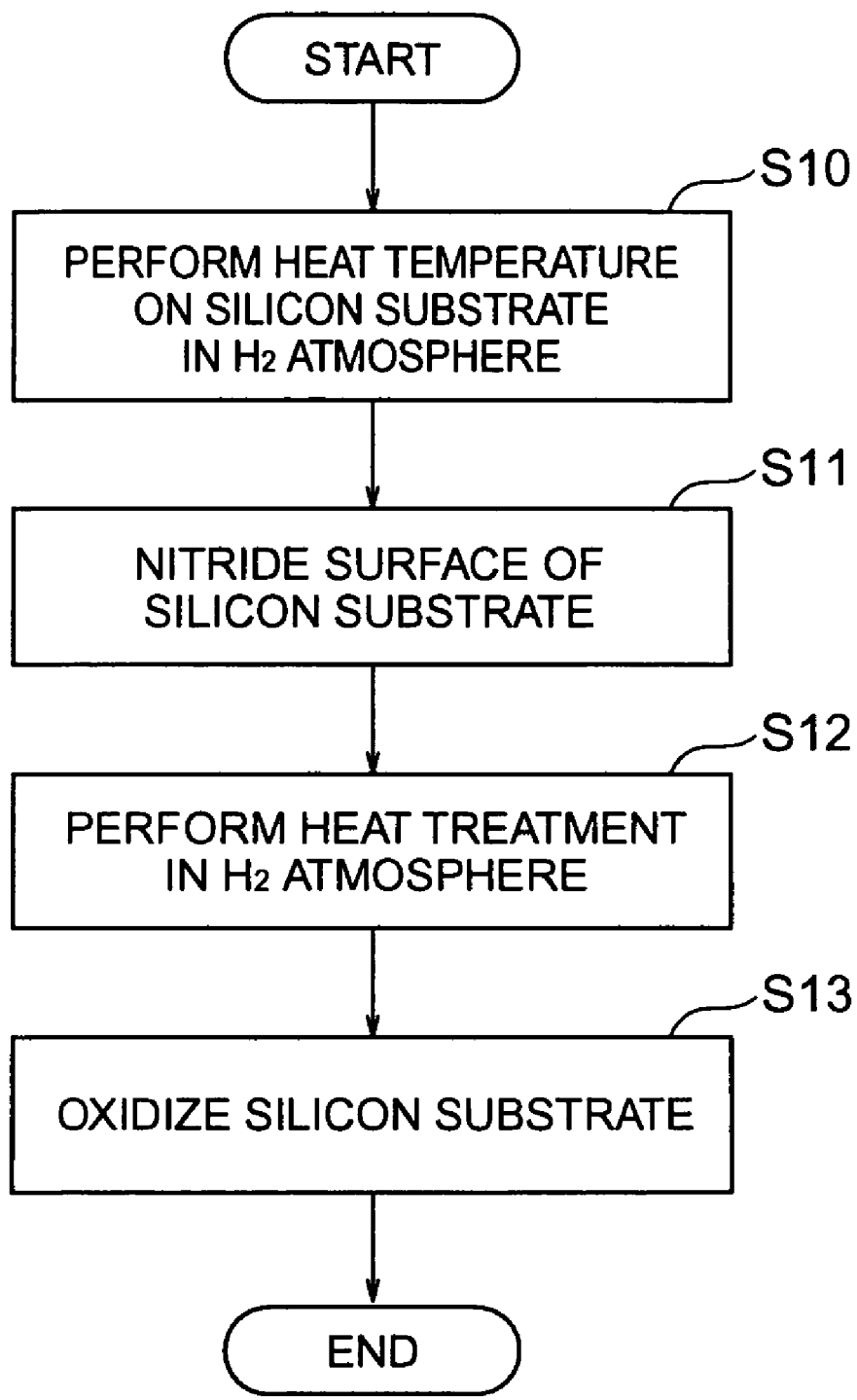
FIG. 14 is a flow chart showing the fabricating steps of a fabricating method according to the sixth embodiment of the present invention.
Figure 15:
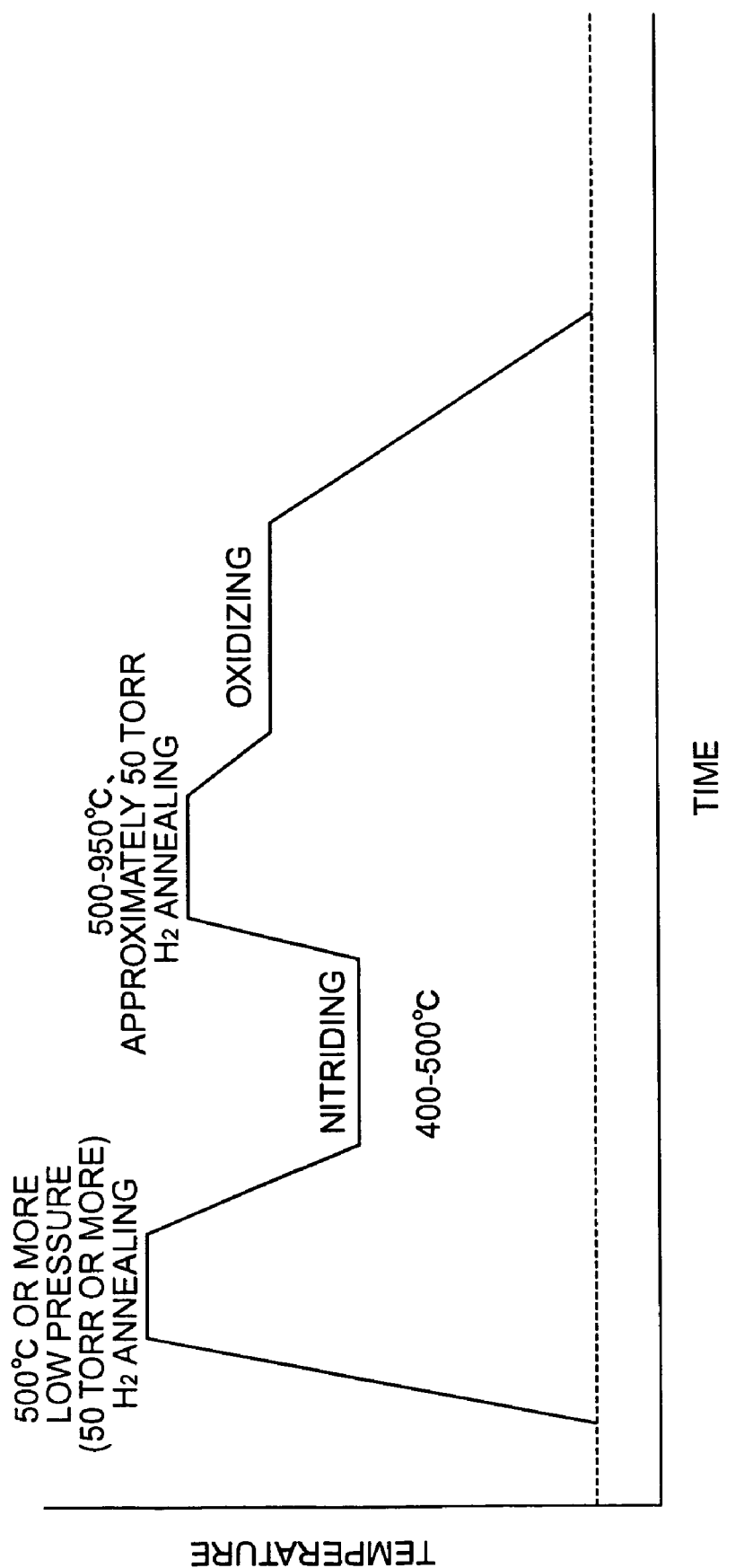
FIG. 15 is a timing chart of a heat treatment in the fabricating method according to the sixth embodiment of the present invention.

Referring to FIG. 14 and FIG. 15, a method for fabricating a semiconductor device according to the sixth embodiment of the present invention will be described below. This embodiment includes step S10 for performing a heat treatment in an $H_2$ atmosphere before step S11 for nitriding the surface of the silicon substrate in the fifth embodiment.

In step S10, the defects on the surface of the silicon substrate are removed by the heat treatment in the $H_2$ atmosphere. Accordingly, the surface of the substrate is flattened. The heat treatment conditions in the $H_2$ atmosphere in step S10 can be optionally set. However, it is preferable that the temperature be equal to or more than a temperature (500° C.) at which silicon atoms can move on the surface of the silicon substrate, and the partial pressure of $H_2$ gas be equal to or more than a pressure (50 Torr) at which silicon atoms are removed. Considering these conditions, the heat treatment conditions of step S10 in this embodiment are set as follows: a temperature of 500° C. or more; and an $H_2$ partial pressure of 50 Torr or more. Because of the heat threatment at step S10, oxygen is removed from the native oxide layer on the surface of the silicon substrate.

After the heat treatment of step S10, step S11 (surface nitriding), step S12 (heat treatment in the $H_2$ atmosphere) and step S13 (oxidation) explained in the descriptions of the fifth embodiment are performed. In this embodiment, the heat treatment in the $H_2$ atmosphere in step S12 is performed under the conditions of a temperature of from 500° C. to 950° C., and a partial pressure of approximately 50 Torr. As in the case of the fifth embodiment, the heat treatment conditions in the $H_2$ atmosphere in this embodiment are set as follows: a temperature (500° C. or more) at which nitrogen (N) and silicon (Si) atoms can move on the surface of the substrate and a temperature (950° C. or less) at which nitrogen (N) atoms do not cohere; and a pressure (50 Torr or more) at which nitrogen (N) atoms are not removed from the surface of the substrate. When the pressure is less than 50 Torr, the surface becomes coarse since SiH desorbs.

In this embodiment, the aforementioned steps are sequentially performed. Although the aforementioned steps can be separately performed, preferably they are sequentially performed in order to form an insulating film having a better film quality.

Furthermore, in this embodiment, it is preferable that the heat treatment in the $H_2$ atmosphere at step S10 be performed at a temperature equal to or more than the temperature at which the heat treatment in the $H_2$ atmosphere at step S12 is performed.

As described above, in the fabricating method of this embodiment, it is possible to set the coordination number of a nitrogen atom in the oxynitride layer to be three, thereby forming a flat interface at an atomic level to considerably decrease a small amount of energy levels in the band gap. Accordingly, when an oxynitride layer formed in accordance with the fabricating method of this embodiment is used as, for example, a gate oxynitride film of an MOS transistor, it is possible to form a device performing constant and stable operations with the fluctuations in threshold voltage being curbed and the degradation of mobility being prevented.

Figure 16:
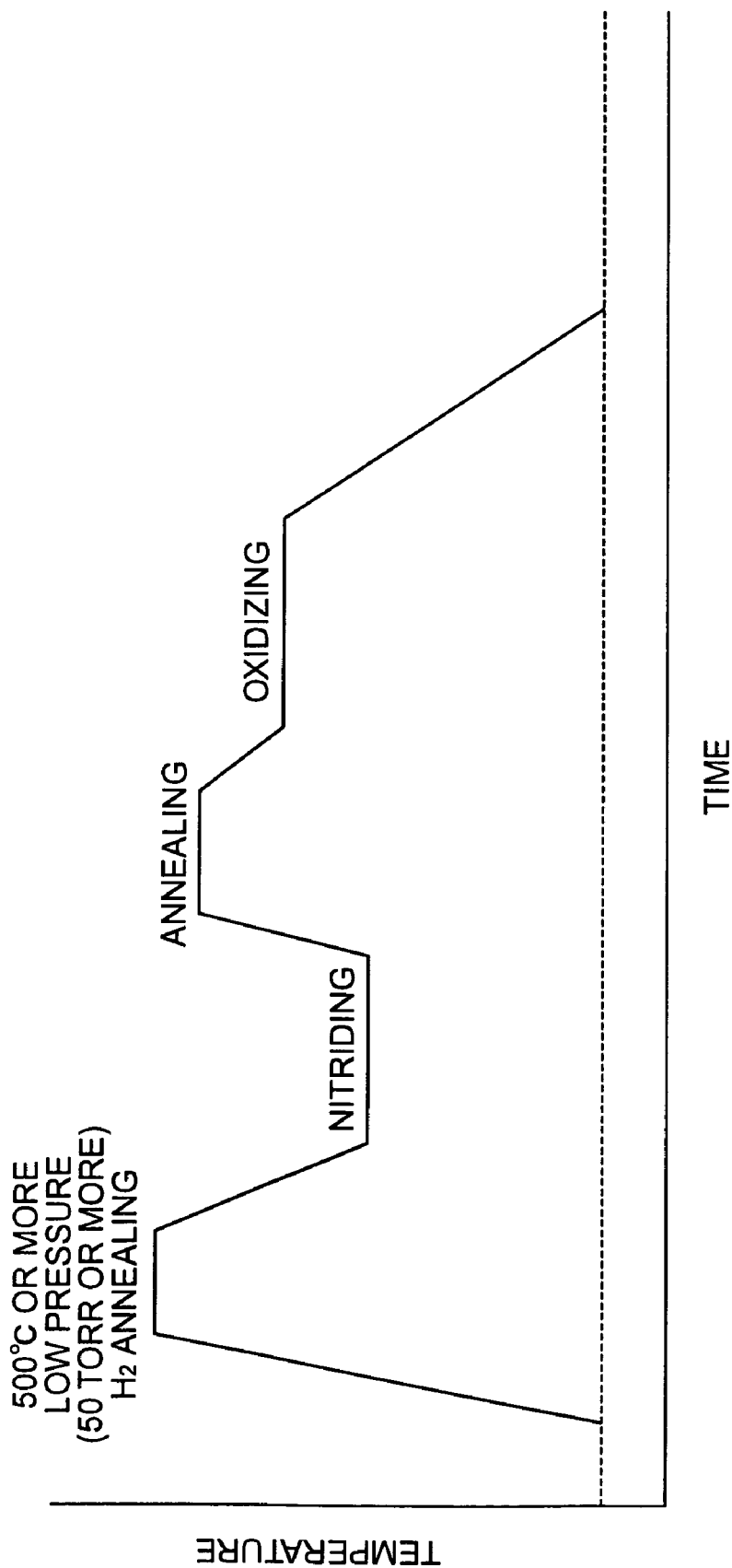
FIG. 16 is a timing chart of a heat treatment in a modification of the first to fourth embodiments.

The heat treatment in the $H_2$ atmosphere like step S10 of the sixth embodiment, which is performed before the nitiriding processing, can also be performed before the nitriding processing in the first to fourth embodiments (FIG. 16). In such a case, unlike the sixth embodiment, the annealing after the nitriding is performed in a nitrogen gas atmosphere instead of an $H_2$ atmosphere.

As described above, according to the embodiments of the present invention, it is possible to obtain an insulating film wherein the energy levels in the band gap are reduced.

As in the case of the first embodiment, in a semiconductor device fabricated in accordance with any of the second to sixth embodiment, the atoms that are the closest to a nitrogen atom in a three-coordinate bond state are silicon atoms, and the atoms that are next closest are atoms other than silicon atoms, e.g., oxygen-atoms.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concepts as defined by the appended claims and their equivalents.

What is claimed is:

1. A method for fabricating a semiconductor device comprising:
   arranging nitrogen atoms on a surface of a silicon substrate;
   performing a heat treatment in a hydrogen atmosphere with a hydrogen partial pressure of 50 Torr or more so that the nitrogen atoms and silicon atoms existing on the surface of the silicon substrate are brought into a three-coordinate bond state; and
   forming a silicon oxide film on the silicon substrate with the three-coordinate bond state of nitrogen atoms and the silicon atoms being maintained.

2. The method for fabricating a semiconductor device according to claim 1, wherein the heat treatment in the hydrogen atmosphere is performed at a temperature of 500° C. or more and 950° C. or less.

3. The method for fabricating a semiconductor device according to claim 2, wherein atoms that are the closest to a nitrogen atom in the three-coordinate bond state are silicon atoms, and atoms that are next closest are atoms other than silicon atoms.

4. The method for fabricating a semiconductor device according to claim 3, wherein the atoms that are next closest are oxygen atoms.

5. The method for fabricating a semiconductor device according to claim 1, wherein atoms that are the closest to a nitrogen atom in the three-coordinate bond state are silicon atoms, and atoms that are next closest are atoms other than silicon atoms.

6. The method for fabricating a semiconductor device according to claim 5, wherein the atoms that are next closest are oxygen atoms.

7. A method for fabricating a semiconductor device comprising:
   performing a heat treatment on a silicon substrate in a first hydrogen atmosphere;
   arranging nitrogen atoms on a surface of the silicon substrate;
   performing a heat treatment in a second hydrogen atmosphere with a hydrogen partial pressure of 50 Torr or more so that the nitrogen atoms and silicon atoms existing on the surface of the silicon substrate are brought into a three-coordinate bond state; and
   forming a silicon oxide film on the silicon substrate with the three-coordinate bond state of the nitrogen atoms and the silicon atoms being maintained.

8. The method for fabricating a semiconductor device according to claim 7, wherein the heat treatment in the first hydrogen atmosphere is performed at a temperature of 500° C. or more.

9. The method for fabricating a semiconductor device according to claim 8, wherein the heat treatment in the first hydrogen atmosphere is performed at a temperature of 500° C. or more, and the heat treatment in the second hydrogen atmosphere is performed at a temperature of 500° C. or more and 950° C. or less, the temperature of the heat treatment in the second hydrogen atmosphere being higher than that in the first hydrogen atmosphere.

10. The method for fabricating a semiconductor device according to claim 8, wherein atoms that are the closest to a nitrogen atom in the three-coordinate bond state are silicon atoms, and atoms that are next closest are atoms other than silicon atoms.

11. The method for fabricating a semiconductor device according to claim 10, wherein the atoms that are next closest are oxygen atoms.

12. The method for fabricating a semiconductor device according to claim 7, wherein the heat treatment in the first hydrogen atmosphere is performed at a temperature of 500° C. or more, and the heat treatment in the second hydrogen atmosphere is performed at a temperature of 500° C. or more and 950° C. or less, the temperature of the heat treatment in the second hydrogen atmosphere being higher than that in the first hydrogen atmosphere.

13. The method for fabricating a semiconductor device according to claim 7, wherein atoms that are the closest to a nitrogen atom in the three-coordinate bond state are silicon atoms, and atoms that are next closest are atoms other than silicon atoms.

14. The method for fabricating a semiconductor device according to claim 13, wherein the atoms that are next closest are oxygen atoms.

* * * * *